United States Patent [19]
Ma et al.

[11] Patent Number: 5,486,723
[45] Date of Patent: * Jan. 23, 1996

[54] PACKAGED INTEGRATED CIRCUIT ADD-ON CARD

[75] Inventors: Abraham C. Ma, Milpitas; Paul Y. J. Hsueh, Concord, both of Calif.

[73] Assignee: MA Laboratories, Inc., San Jose, Calif.

[*] Notice: The portion of the term of this patent subsequent to Nov. 8, 2011, has been disclaimed.

[21] Appl. No.: 335,131

[22] Filed: Nov. 7, 1994

Related U.S. Application Data

[63] Continuation of Ser. No. 68,250, May 27, 1993, Pat. No. 5,362,985.
[51] Int. Cl.⁶ .................................................. H01L 23/02
[52] U.S. Cl. ........................................ 257/707; 257/697
[58] Field of Search ............................ 257/679, 720, 257/786, 722, 784, 718, 782, 719, 706, 707, 714, 720, 721, 692, 722, 717, 719, 773, 774, 698, 697; 439/485, 70, 71, 72; 174/16.1, 16.2

[56] References Cited

U.S. PATENT DOCUMENTS

| | | | |
|---|---|---|---|
| 4,994,903 | 2/1991 | Wroe et al. | 257/720 |
| 5,045,922 | 9/1991 | Kodoma et al. | 257/698 |
| 5,180,097 | 1/1993 | Zenshi | 228/180 |
| 5,198,693 | 3/1993 | Imken et al. | 257/720 |
| 5,298,791 | 3/1994 | Liberty et al. | 257/707 |

Primary Examiner—Sara W. Crane
Assistant Examiner—S. V. Clark
Attorney, Agent, or Firm—Lyon & Lyon

[57] ABSTRACT

An add-on card which has a flat surface on the top side on which a plastic quad flat pack integrated circuit packaged integrated circuit can be soldered upon. The other side of the add-on card has downwardly protruding pins that can plug into a pin grid array integrated circuit socket. A method of manufacturing a add-on card whereby bonding pads are disposed on one side of the add-on card and pins are disposed on the other side of the add-on card.

11 Claims, 6 Drawing Sheets

PACKAGED INTEGRATED CIRCUIT ADD-ON CARD

This is a continuation of application Ser. No. 08/068,250 filed on May 27, 1993 now U.S. Pat. No. 5,362,985.

BACKGROUND OF THE INVENTION

The field of the present invention generally is integrated circuit packaging.

A PGA package has pins protruding downward from its body and is inserted into a socket that contains female type openings that correspond to the pins on the PGA. The socket is soldered to a circuit board either directly onto the surface or in plated through holes.

The PQFP has output leads extending downward and outward from the body and is designed to be soldered directly onto the surface of a board, i.e., surface mounted. The leads on the PQFP are disposed in rows around the periphery of the package. The LGA package has leads that are almost flush with the bottom of the integrated circuit package, and like the PQFP, is soldered directly onto the surface of a circuit board. LGA packaged integrated circuits generally have their leads disposed in two different fashions. A first type of LGA package disposes its leads in a matrix that covers the entire bottom surface of the package. A second type of LGA disposes its leads around the periphery of a package, such that the bottom of the package has an area that is surrounded by but does not contain leads.

When comparing the PQFP, LGA and PGA packages, it is seen that use of a PGA package is often more desirable than either PQFPs or LGAs because board insertion requires no soldering. Additionally, the use of PGA packages allows for simple component removal and upgrading. Because of these advantages, circuit boards are often designed to accept PGA packages.

In a modern manufacturing environment, parts are often delivered to the factory as close to the time they are needed as possible, so-called "just in time delivery." Since PQFP and LGA packages cannot be substituted for PGA packages, should a PGA packaged part be unavailable on a particular day, an entire manufacturing facility could be shut down. This situation has created the need for a product that allows flat pack and LGA packaged integrated circuits to be inserted into PGA package sockets.

An add-on card that allows PQFP or LGA packaged integrated circuits to be inserted into PGA package sockets allows for more convenient manufacturing. By pre-soldering quad flat-pack packages to the add-on board, the user can produce large quantities of integrated circuits that can be inserted into PGA package sockets. Since the PQFP-to-add-on card or LGA-to-add-on card assembly is manufactured prior to reaching the factory floor, the PQFP or LGA packaged integrated circuit can be inserted into the PGA package sockets at any stage during assembly without tedious soldering procedures. This saves circuit board production time and facilitates "just in time delivery." Therefore, an inexpensive add-on card that accomplishes this conversion is desirable.

An inexpensive and durable add-on card improves the quality of products containing PQFP and LGA packaged integrated circuits. Higher quality is accomplished because such an add-on card would allow for individual testing of the integrated circuit prior to insertion onto the board. This testing checks the functionality of the integrated circuit as well as the integrity of the package-to-add-on card Soldering. Without the use of an add-on card, the entire board must be tested in order to check package-to-board solder integrity.

The use of an add-on card also leads to cost savings opportunities. Because PQFP packaged integrated circuits use less expensive materials and manufacturing processes, they cost substantially less than PGA packaged integrated circuits. In fact, the combined cost of the PQFP packaged integrated circuit, an add-on card, and assembly cost is still lower than a PGA packaged integrated circuit, thereby lowering the cost of the product containing the PQFP.

The use of an add-on card provides many other advantages as well. The use of an add-on card allows for a reduction in the amount of part inventory a factory keeps stocked. This helps to achieve a "just in time" manufacturing scheme. In a just in time delivery scheme, as discussed-;above, parts are delivered to the factory at as close a time to their need as possible. This has been found to reduce cost and improve quality. Performing a just in time delivery scheme, however, is difficult. Any problems in execution can lead to manufacturing costs that exceed the cost of not using the system. Since maintaining large inventories of integrated circuits and computer boards is a large expense, it is desirable to have a low inventory. By using an add-on card, the integrated circuits can be pre-soldered onto it, stored on shelves, and installed on computer boards at shipping time. Integrated circuit inventory is kept low because it is easier to solder PQFP packaged integrated circuits onto add-on cards than to solder them onto computer boards.

Another advantage of the use of an add-on card is the ability to easily upgrade components. When newer or better performing integrated circuits become available, it is desirable and often necessary to replace the older ones. It is also desirable to be able to perform this change at either the factory or the user. Both flat packs and LGAs are soldered directly to circuit boards. Therefore, neither can be removed from a board without a high probability of component or board damage. By using an add-on card, the PQFP-to-add-on card or LGA-to-add-on card assemblies become modules that can easily be inserted or removed from circuit boards, thereby making component upgrade feasible.

There are three different basic types of prior art add-on cards. The first prior art add-on card uses a fiberglass board. The leads of the add-on card are either punched or screwed into the board. On the side of the board opposite the pins are bonding pads. The pins of the add-on card are placed in electrical connection with the bonding pads by routing vias from either the pin side or bonding side of the board to the pin. The via is electrically connected to the pin at either the point where the pin emerges to the bonding side of the board or where the pin enters the hole on the pin side of the board.

This type of board suffers from shortcomings. Firstly, because the vias must be disposed throughout the surface of the board, shielding devices for shielding electromagnetic interference cannot be used on either side of the board. Secondly, the attachment and alignment of the flat pack on the card is cumbersome and cost intensive.

A second prior art add-on card uses a two layer circuit board. The first layer holds the pins and the second layer holds the bonding pads. The pin layer has holes formed all the way through. Pins are inserted within the holes and soldered. There is also an array of connection holes formed in the interior surface (the side that is attached to the bonding pad layer). The connection holes are electrical conductors formed therein. The pins are placed in electrical connection with the bonding pads by routing a via on either the bottom of the pin layer or top of the pin layer from the pin to one of the electrically conductive connection holes.

The bonding pad layer is attached to the pin layer by having a matrix of pin points disposed on its interior surface (the side that is attached to the pin layer) placed in the electrically conductive connection holes in the pin layer. The pin points are routed to the bonding pads by vias disposed on the top surface of the bonding pad layer. The bonding pad layer has electromagnetic shielding on both its interior surface and bonding pad surface. However, no shielding is placed on the pin layer. This can cause interference with the signals in the vias of the pin layer. Additionally, as with the first type, the attachment and alignment of the flat pack is cumbersome and cost intensive.

A third prior art add-on card uses a single layer circuit board. The pin surface of the circuit board has pin pads formed thereon that are routed by a system of vias on both sides of the board to the mounting pads in order to fasten the pins to the board, a plastic brace must be formed around the pins. The plastic brace holds the pins in an array that allows insertion into a PGA socket. Solder paste is placed on the pin side of the board in an array that matches the footprint of the pins. The pins, held in proper form by the plastic brace, is then placed onto the pin side of the board such that the tops of the pins are placed in the solder paste. The plastic brace used in this add-on card provides disadvantages of increased material cost and increased weight. Additionally, the pins which were held by the plastic brace tend to separate from the board after the PQFP is installed on the board and placed into the reflow oven. This separation occurs because the plastic brace and the fiberglass board have different thermal coefficients of expansion. This can cause quality problems. Finally, because the board has vias routed on both sides of the board, a shielding plate cannot be used. This can increase electromagnetic interference problems.

SUMMARY OF THE INVENTION

The present invention is directed to an improved flat pack to pin grid array adapter card assembly and the manufacture of such cards.

In a first separate aspect of the present invention, a flat pack to pin grid array adapter card includes means for creating a centering force that centers the leads of a flat pack packaged integrated circuit onto pads on the bonding surface of a board. Cooling vents on the board are bounded by the bonding pads.

In another separate aspect of the present invention, a method of manufacturing integrated circuit adapter cards includes the formation of cavities on one side of a circuit board and the placement of bonding pads on the other. Solder paste is used to fill the cavities which than receives pins therein to be soldered to the circuit board by heating thereof.

Accordingly, it is a principal object of the present invention to provide an improved add-on card and to separately provide improved manufacturing techniques therefor. Other and further object and advantages will appear hereinafter.

BRIEF DESCRIPTION OF THE DRAWINGS

Reference is made to the accompanying drawings in which is shown illustrative embodiments of the invention, from which its novel features and advantages will be apparent to those of ordinary skill in the art.

DESCRIPTION OF THE PREFERRED EMBODIMENT

Figure 1:
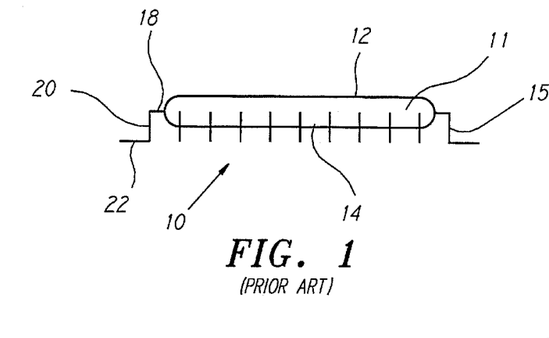
FIG. 1 is a side view of a typical quad flat pack package for an integrated circuit with its leads formed.

Referring to the drawings, and in particular, FIG. 1, there is seen a typical plastic quad flat pack (PQFP) packaged integrated circuit 10. The PQFP 10 consists generally of a body 11 and leads 15. Inside of the PQFP 10 is an integrated circuit die (not shown). Leads 15 are connected to bonding pads (not shown) on the die. The leads 15 exit the body 11 of the PQFP 10, thereby allowing electrical connection between the integrated circuit die and a circuit board (not shown).

Figure 2:
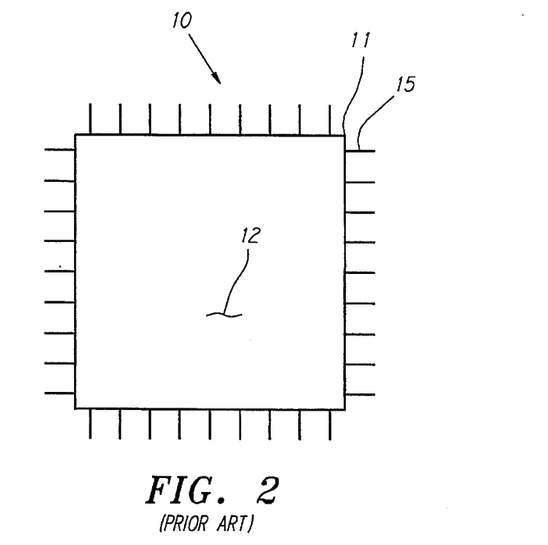
FIG. 2 is a top view of a typical plastic quad flat pack for an integrated circuit.

As shown in FIG. 1, the leads 15 of a typical PQFP 10 are formed into three sections, all three sections being integral to the other. An extension 18 extends outward from the PQFP 10, thereby being substantially parallel to a first surface 12 and a second surface 14 of the body 11 of the PQFP 10. A leg 20 extends from the extension 18 towards the second surface 14. A foot 22 extends at a ninety degree angle from the leg 20, in a direction away from the PQFP 10. The foot 22 is the portion of lead 15 that is normally soldered to the circuit board (not shown). FIG. 2 shows a top view of a PQFP 10. It shows the leads 15 extending in an outward fashion away from the PQFP 10 body 11.

Figures 3, 4:
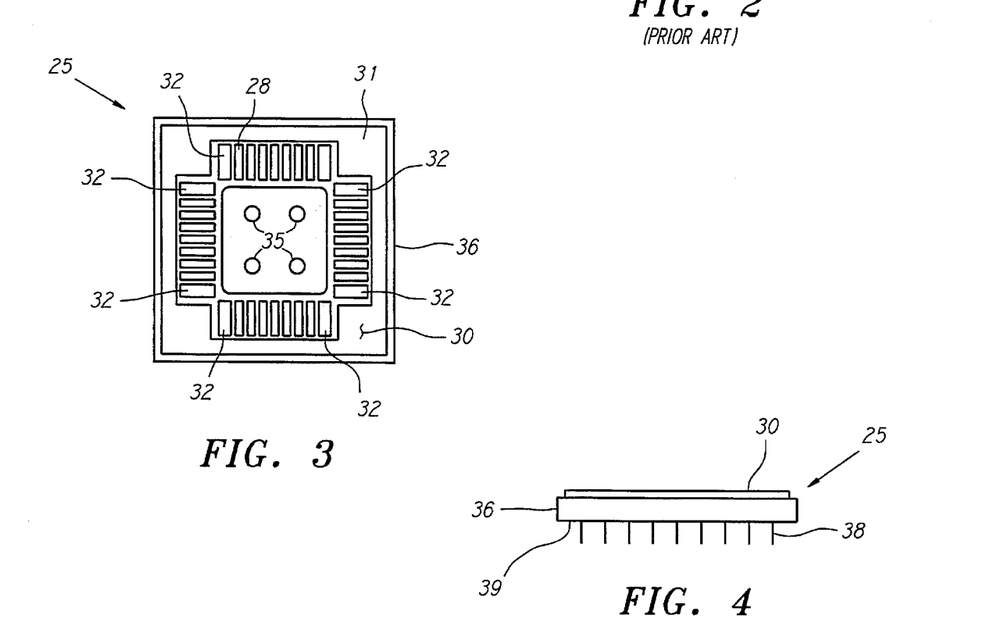
FIG. 3 is a top view of a plastic quad flat pack add-on card.
FIG. 4 is a side view of the plastic quad flat pack add-on card of FIG. 3.

FIG. 3 shows a top view of an embodiment of the add-on card of the invention. The add-on card 25 is preferably substantially square and has centering pads 28 disposed on the add-on card's bonding surface 30. The centering pads 28 are arranged so that they correspond to leads 15 of the PQFP 10, thereby allowing the PQFP 10 to be soldered onto the add-on card 25. In a typical embodiment, there are four rows of centering pads 28, with each row having two rows that are perpendicular to itself.

The centering pads 28 are printed onto the add-on card's bonding surface 30 using printed circuit board techniques well known to the art. The centering pads 28 on the add-on card 25 are made such that they are slightly longer and wider than the foot 22 of the PQFP 10. In a preferred embodiment, the bonding pad 28 is approximately twenty percent longer and thirty percent wider than the footprint of the foot 22.

Figure 16A:
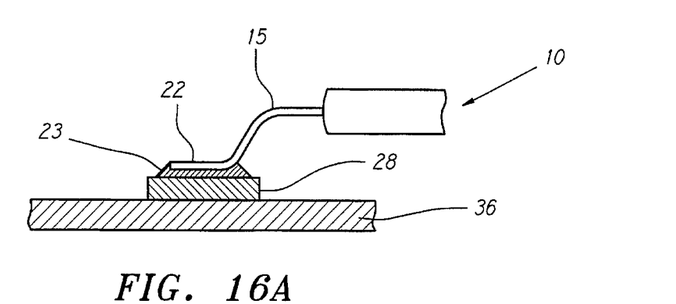
FIG. 16A is a cross-sectional view of a bonding portion of a PQFP lead that is soldered to a centering bonding pad.
Figure 16B:
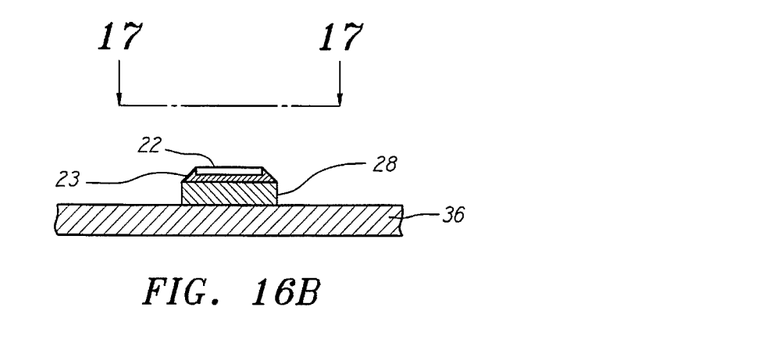
FIG. 16B is another cross-sectional view of a bonding portion of a PQFP lead that is soldered to a centering bonding pad.
Figure 17:
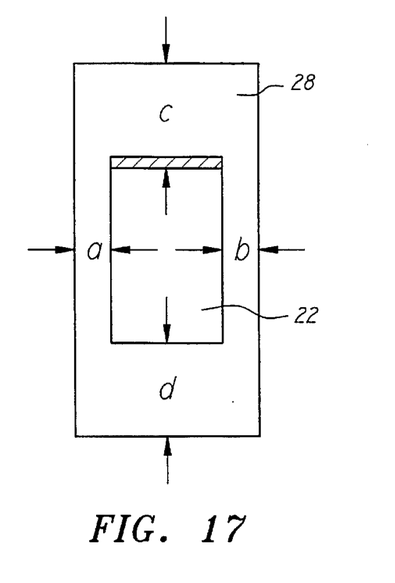
FIG. 17 is a top view of a bonding portion of a PQFP lead that is soldered to a centering bonding pad.

Making the centering pads 28 slightly larger than the foot 22, as shown in FIG. 16A, FIG. 16B and FIG. 17, creates a centering force that is very advantageous. When solder 23 is placed on a centering pad 28, it forms a half-moon shaped cross-section that has a certain amount of surface tension. By making the centering pad 28 larger than the foot 22, more solder 23 than normal is placed on the centering pad 28, which increases the surface tension created by the solder 23. The increased surface tension created by the solder 23 on the centering pad creates a force that pulls the PQFP's leads 15 to the center of the centering pad 28. The combination of all the forces created by all the centering pads aligns the PQFP 10. As seen in FIG. 16A and FIG. 16B, the leads 15 are placed on the centering pads 28, which had solder 23 paste applied prior to package mounting. Solder 23 paste bonds to both the centering pad 28 and the lead's foot. It also surrounds the edges of the lead's 15 foot 22. Therefore, in addition to acting to center the leads 15, the oversized centering pad 28 helps form a stronger solder connection.

When designing the centering pad 28, however, care must be taken so that the pad 28 is not made too large. A typical PQFP 10 has many leads (generally well over one-hundred). The typical lead spacing of such a PQFP is fifty or twenty-five mils. A centering pad 28 that is too large will come too close to the adjacent pad which can cause the solder 23 to bridge between the centering pads 28 resulting in short circuits. However, centering pad 28 width is the limiting dimension since only a centering pad 28 that is too wide will cause bridging and shorts. The bonding pad's 28 length is not limited by this factor and therefore, it is possible to make the centering pad 28 significantly longer than foot 22. Experimentation has found that increasing the length of the centering pad 28 creates a more effective solder connection between the foot 22 and the centering pad 28. As shown in FIG. 17, in a quad pack, melted solder surface tension will center foot 22 to pad 28 thereby making distances "a" equal to distance "b". When the PQFP 10 is centered on the add-on card 25, adequate distances "c" and "d" are available for the solder 23 paste to bond to.

The centering force created by the centering pad 28 leads to many advantages. Firstly, it makes soldering PQFPs 10 to the add-on card 25 simpler because placement is aided by the solder's centering force. The centering force also quickens PQFP 10 to add-on card 25 soldering because initial PQFP 10 alignment on the add-on card is not as critical as in the prior art. Thirdly, quality is increased because the PQFP's 10 leads 15 are better centered on the centering pad 28 while the solder connection itself has higher integrity due to increased soldering area. Higher solder connection integrity results due to the solder being able to cling to and rise around feet 22. Finally, the centering pad 28 acts to minimize solder bridging, an undesirable occurrence.

In addition to the centering pads 28, there are also eight corner alignment pads 32. The corner alignment pads 32 are located at the outer positions for each row of centering pads 28. In one embodiment, the corner:alignment pads 32 are longer and wider than the centering pads 28. This increased size creates even greater force for aligning than that provided by the centering pads 28, which in turn provides an even stronger centering force on the PQFP 10. This greater aligning and centering force increases the benefits (discussed above) provided by the centering pads 28. It should be noted, however, that the vast majority of the centering force is provided by centering pads 28. The corner alignment pads 32 only increase the centering effect.

As shown in FIG. 3, a plurality of vents 35 are disposed in the add-on card 25. The plurality of vents 35 aid in cooling the integrated circuit disposed within the PQFP 10, which will be discussed below. Analysis has determined that there should be at least three vents 35.

Disposed on bonding surface 30 is a copper area 31, which is connected to the ground pin (not shown) of the add-on card 25. This is shown in FIG. 3. In the preferred embodiment, a first copper area 31 covers as much of the bonding surface 30 as is possible. First copper area 31 functions as a shield against electromagnetic waves and lowers the electrical noise that is transmitted to the integrated circuit. Using first copper area 31 also helps to dissipate heat away from the PQFP 10. As is well known, copper is an excellent conductor of heat. Thus, any heat created by the integrated circuit that reaches first copper area 31 will be conducted to the copper and away from the circuit to the vents 35.

FIG. 4 shows a side view of add-on card 25. As shown, add-on card 25 has pins 38 extending downwardly away from the bottom surface 39 of the add-on card 25.

Figure 5:
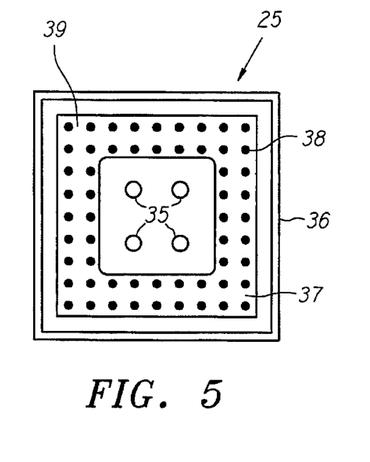
FIG. 5 is a bottom view of the plastic quad flat pack add-on card of FIG. 3.

FIG. 5 shows a bottom view of an embodiment of the add-on card 25 of an aspect of the invention. The add-on card 25 has a plurality of pins 38 that extend perpendicularly out from one surface of the card 25. The pins 38 of the add-on card 25 must be placed such that each lead 15 on the PQFP 10 is connected to the proper pin 38 on the add-on card 25, i.e., lead number one of the PQFP 10 must correspond to pin number one of the add-on card 25. Furthermore, the pins 38 of the add-on card 25 are arranged such that they have the identical pin-out and geometry of a PGA of the same pin count. This will allow the add-on card 25 to be inserted into a standard pin grid array socket 40 (shown in FIG. 8). Also shown are vents 35, which aid in cooling the integrated circuit disposed within, the PQFP 10. This cooling effect is discussed below.

As with the bonding surface 30, the pin surface 39 of the add-on card 25 has a second copper area 37 disposed thereon. As in the first copper area 31, the second copper area 37 is preferably made as large as possible and provides the same functions as the first copper area 31.

Figure 6:
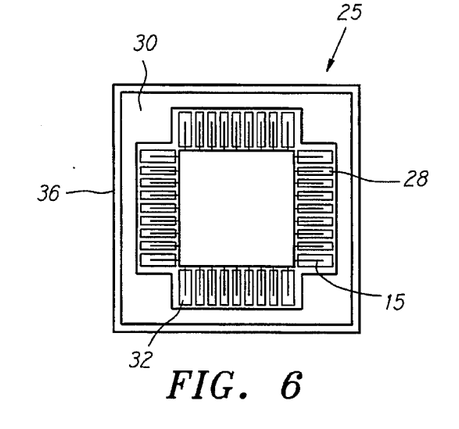
FIG. 6 is a top view of a plastic quad flat pack soldered onto the plastic quad flat pack add-on card of FIG. 3.
Figure 7:
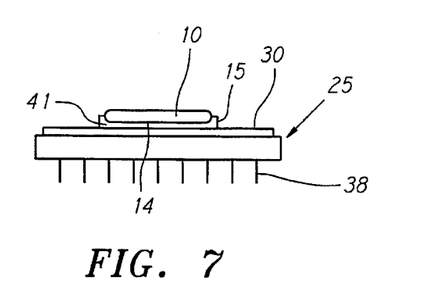
FIG. 7. is a side view of the assembly of FIG. 6.

FIGS. 6 and 7 show a PQFP 10 soldered onto an add-on card 25. It is seen that each of the leads 15 of the PQFP 10 correspond to a centering pad 28 and corner alignment pad 32 of the add-on card 25. For reasons that will become apparent, it is advantageous to install the PQFP 10 such that a first gap 41, shown in FIG. 7, exists between the second surface 14 of the PQFP 10 and the bonding surface 30 of the add-on card 25.

Figure 8:
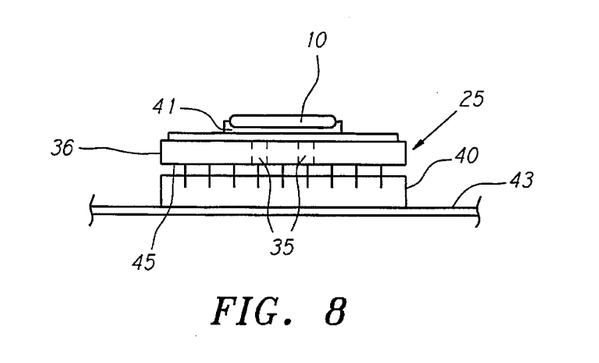
FIG. 8. is a side view of the assembly of FIG. 6 inserted into a pin grid array socket.

Referring to FIG. 8, the add-on card's 25 increased integrated circuit cooling effect will now be illustrated. FIG. 8 shows a complete installation, including a PQFP 10, an add-on card 25, a PGA socket 40, and a circuit board 43. As is well known, a body that is warmer than its surroundings will create convectional air currents. This convection air flow causes air flow past the PQFP 10. The add-on card 25 of the invention, through its use of vents, is constructed so as to take maximum advantage of the convection currents created by the increased temperature of the integrated circuit.

When inserting the add-on card 25 into the PGA socket 40, a second gap 45 is advantageously left between them. Air circulates through this second gap 45 on all sides of the add-on card 25 and passes through the vents 35 that are disposed in the add-on card 25. The air passing through the vents 35 then passes through the first gap 41 between the add-on card 25 and the PQFP 10. This air acts to cool the PQFP 10, which in turn cools the integrated circuit disposed therein. The air then flows through the spaces between the leads 15 of the PQFP 10 and out to the surroundings. This convectional flow of air provides cooling of the integrated circuit in excess of that normally provided. The vents 35 should be made as large as possible. Care must be taken, however, to avoid making the vents 35 too large. Vents 35 that are too large will reduce the structural rigidity and lessen the electromagnetic wave suppression capability of the add-on card 25.

Figure 9:
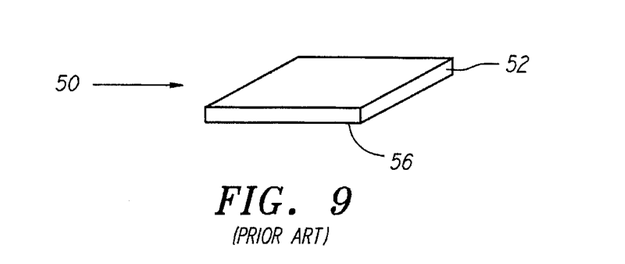
FIG. 9 is a top view of a land gate array packaged integrated circuit.

Referring to FIG. 9, an embodiment of the invention used for adapting land gate array packages for use in PGA sockets will now be described. FIG. 9 shows an LGA package 50. Just as in the PQFP 10, there is an integrated circuit die (not shown) disposed within LGA body 52. In one embodiment, shown in FIG. 10, the LGA 50 has solder points 54 disposed in a matrix that covers the entire second surface 56 of the LGA 50. In another embodiment, shown in FIG. 11, the solder points 62 are disposed on the bottom surface 66 and along the edge 64 of LGA 60, thereby forming a square or rectangular ring of solder points 62. The solder points 62 are connected to the integrated circuit die (not shown) disposed within the LGA 60, thereby forming electrical connections between a circuit board (not shown) and the die.

Figure 10:
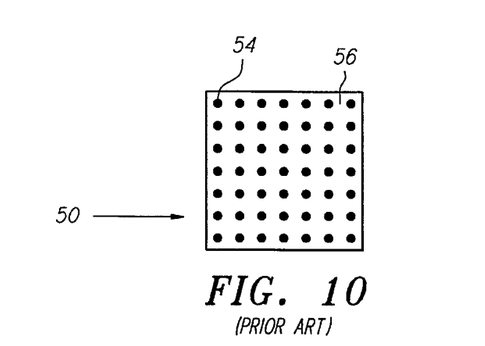
FIG. 10 is a bottom view of a one embodiment of the land gate array packaged integrated circuit of FIG. 9.
Figure 11:
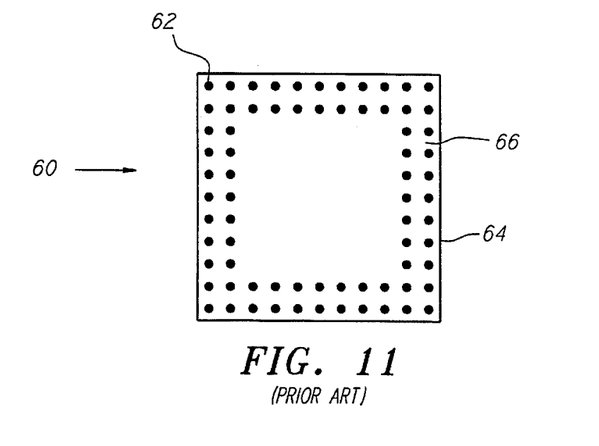
FIG. 11 is a bottom view of a second embodiment of the land gate array packaged integrated circuit of FIG. 9.
Figure 12:
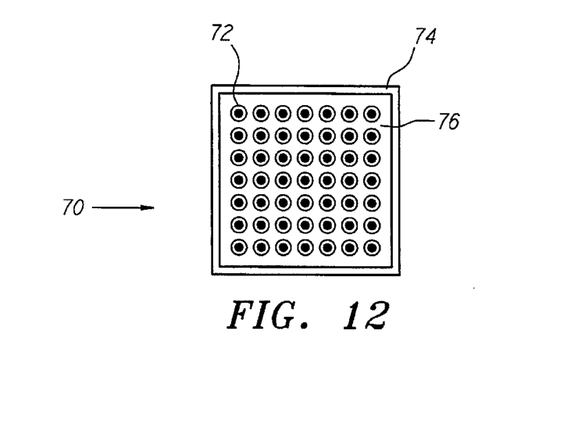
FIG. 12 is a top view of a land gate array add-on card.

The embodiment of FIG. 10 will be used to describe the LGA-to-add-on card embodiment of the invention. It is important to note, however, that the LGA 60 of FIG. 11 is attached to an add-on card in much the same fashion. FIG. 10 shows the second surface 56 of the LGA 50. The solder points 54 of the LGA are formed such that they are almost flush with the bottom surface 56 of the LGA 50. An add-on card 70 adapted to mate with an LGA 50 is shown in FIG. 12. The add-on card 70 has centering pads 72 on its bonding surface 74 that correspond to the solder points 54 on the second surface 56 of the LGA 50. The centering pads 72 are formed such that they are larger than the solder points 54 of the LGA 50.

Centering pads 72 create a centering force which is exerted when solder paste is applied and heated. The centering force in the LGA-to-add-on card embodiment occurs for much the same reason as it does in the PQFP-to-add-on card embodiment. The centering pad 72 allows a larger solder ball to be deposited thereon. The larger solder ball surface tension which acts to create the centering force. As discussed above, the centering force works to pull soldering point 54 of the LGA 50 to the center of the centering pad 72, thereby improving and facilitating alignment between the solder points 54 of the LGA 50 and the centering pads 72 of the add-on card 70.

The advantages of using centering pads 72 for LGA package add-on cards 70 are similar to those encountered with PQFP add-on cards 25. When using LGA's 50, however, the advantages are even more important. As discussed above, the solder points 54 on an LGA 50 are almost flush to the bottom surface 56 of the LGA 50. Thus, the LGA 50, unlike other types of integrated circuit packaging, has little that can be used to align or hold it in place while it is positioned on the add-on card 70. The centering force provided by the centering pads 72 acts to pull the LGA 50 to its proper location without the use of external leads, pins or fixtures to hold the package in place.

As with the PQFP 10 add-on card 25, the LGA add-on card 70 has a copper area 76 disposed on the bonding surface 74. The copper surface 76 is preferably made as large as possible. As with the copper surfaces 31, 37 of the PQFP 10 add-on card, the copper surface 76 functions to suppress electromagnetic radiation, reduce electronic noise transferred to the integrated circuit and aid in heat dissipation. A copper surface is also disposed on the bottom surface (not shown) of the LGA 50 add-on card.

Figure 18:
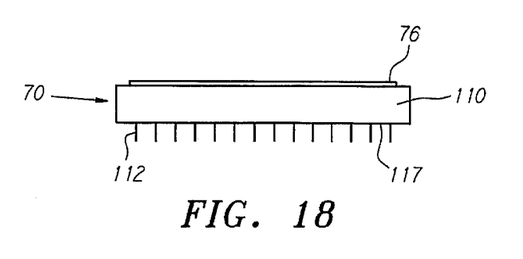
FIG. 18 is a side view of an add-on card for mounting an LGA packaged integrated circuit into a PGA socket.

As shown in FIG. 18, the LGA package add-on card 70 has a board 110, and pins 112 emerging from the add-on card's 70 pin surface 117.

The add-on card can be assembled using many different methods. The preferred methods discussed herein will focus on the PQFP 10 add-on card 25. The LGA 50, 60 add-on cards 74 may be assembled in much the same fashion.

Figure 14:
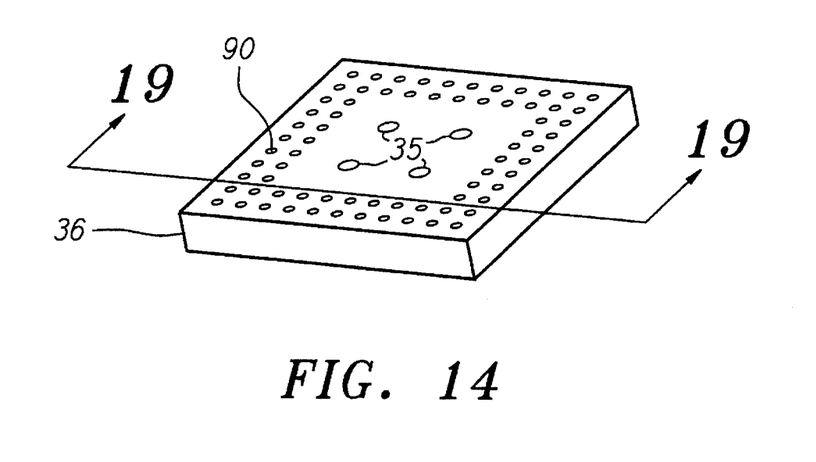
FIG. 14. is a perspective view of the bottom of an add-on card during manufacture.
Figure 19:
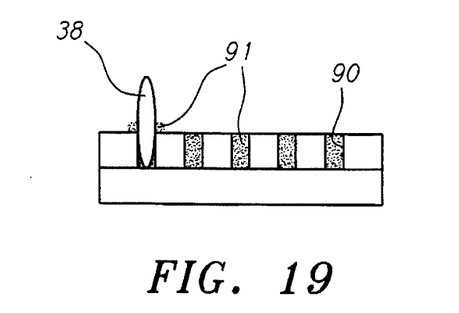
FIG. 19 is a cross-sectional view of an add-on card having a two layer circuit board during manufacture.
Figure 20:
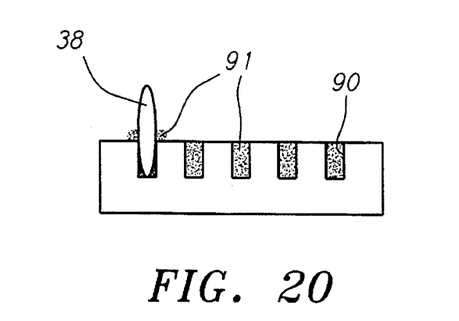
FIG. 20 is a cross-sectional view of an add-on card having a single layer circuit board during manufacture.

In a first method, the add-on card's board 36 is constructed using either a single layer or a two layer fiberglass circuit board. In this method, holes 90 are drilled or formed in the pin surface 39 of the add-on card's 25 board 36, as shown in FIG. 14, FIG. 19 and FIG. 20. The holes 90 are formed partially through the single layer board 36, preferably half-way, as shown in FIG. 20, or all the way through one layer of the two layer board 36, as shown in FIG. 19. Solder paste 91 is then placed in holes 90. After applying the solder paste to the holes 90, preferably filling them completely, the pins 38 are inserted. The add-on card 25 with the pins 38 inserted is then heated. This heating process melts the solder surrounding the base of the pin. The add-on card 25 is then cooled, thereby forming a secure hold on the pins 38. Pin 38 is put in contact with the centering pad 28 via circuitries (not shown) between the circuit board layers and on the bonding surface 30 of the add-on card 25.

The use of a two layer circuit board has advantages. Firstly, the holes 90 can be drilled all the way through the particular circuit board layer that forms the pin surface. This is much easier than drilling hole half-way through a single layer circuit board. An additional advantage is that using a two layer board increases the surface area that can be used for printed circuitry, there being two additional surfaces available (the inner surfaces of each circuit board layer).

Figure 13:
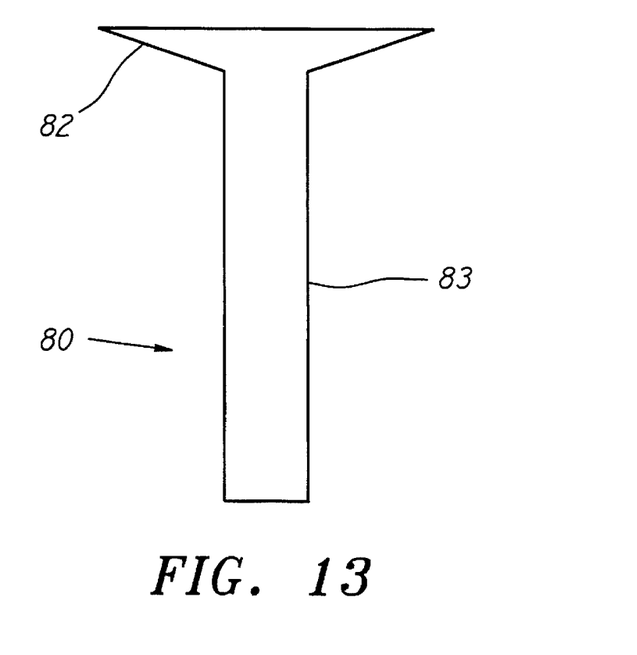
FIG. 13. is a side view of a pin of on an add-on card.
Figure 15:
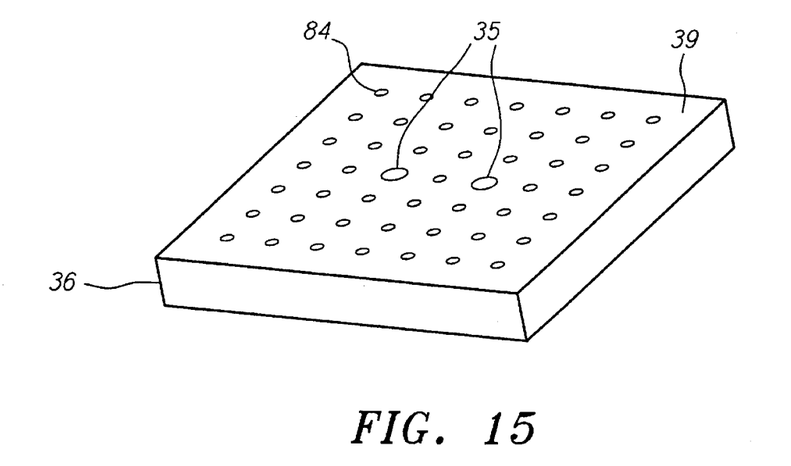
FIG. 15 is a perspective view of the bottom of an add-on card during manufacture in accordance with a second embodiment.

Another manufacturing method is to use a pin 80 that has a mounting head 82 at one end, as shown in FIG. 13. The pin 80 is inserted into a fixture (not shown) with mounting head 82 sticking out of the fixture. The fixture holes (not shown) are only slightly larger than the shank 83 of the pin 80 so that the pins 80 are securely held in place during the next few steps. The fixture has protruded alignment studs that align the pins. The fixture may use the edge of the board or, holes disposed on the add-on card, e.g., preferably the vents 35 (as shown in FIG. 15). The fixture's pin pattern matches that of a PGA's pin pattern so that the resulting add-on card 25 can be easily inserted into a PGA socket. On one surface of the add-on card's 25 board 36, there are pin pads 84 found thereon that match the pin layout of the fixture and the PGA socket. The pin pads 84 are formed so as to be slightly larger than the mounting head 82 of the pin 80. Using a stencil matching the pin layout of the PGA socket, a thin layer of solder paste is disposed on the pin pads 84. The fixture containing the pins 80 is then placed on the add-on card 25. The technician or machine that performs this operation must be sure to match the alignment studs of the fixture to the vents 35 of the board. Aligning the studs on the fixture to the proper alignment points, e.g., the vents 35, on the board. Aligning the studs on the fixture to the vents 35 on the board allows precise placement of the pin's 80 mounting head 82 onto the pads 84 on the add-on card 25.

Once the fixture is placed on the add-on card 25, the assembly is placed in a reflow oven (not shown) that melts the solder, thereby securing the pins 82 to the add-on card 25.

The solder used to fasten the pins 80 to the add-on card 25 is chosen such that it melts at a higher temperature than the solder used to fasten a PQFP 10 or an LGA 50, 60 to an add-on card 25. This is done so that the solder used to hold the pins 80 onto the add-on card 25 does not melt when a PQFP-to-add-on card or LGA-to-add-on card assembly is put through solder reflow.

Thus, an improved add-on card is disclosed. While embodiments and applications of this invention have been shown and described, it would be apparent to those skilled in the art that many more modifications are possible without departing from the inventive concepts herein. The invention, therefore is not to be restricted except in the spirit of the appended claims.

What is claimed is:

1. An add-on card which may be used to connect a land gate array packaged integrated circuit to an integrated circuit socket comprising:

a board having a bonding surface and a pin surface, said board having a first board layer with containing said bonding surface and a second board layer containing said pin surface;

an array of rows and columns of mounting pads disposed on said bonding surface of said board, said plurality of mounting pads having greater surface area than solder points on the land gate array packaged integrated circuit that will be bonded thereto; and a plurality of pins fastened to said pin surface of said circuit board, said plurality of pins arranged so that said plurality of pins fit into a pin grid array socket, each of said plurality of pins electrically connected to said one of said mounting pads via circuitries between said first board layer and said second board layer.

2. The add-on card of claim 1 wherein said first board layer and said second board layer are comprised of a fiberglass material.

3. The add-on card of claim 2 further comprising a first and second copper area, said first copper area disposed on said bonding surface of said first board layer and said second copper area disposed on said pin surface of said second board layer, said first and second copper surfaces in electrical communication with a grounding pin.

4. An add-on card which may by used to connect a flat pack packaged integrated circuit to an integrated circuit socket comprising:

a board having a bonding surface and a pin surface, said board having a first board layer with containing said bonding surface and a second board layer containing said pin surface, said board further comprising a plurality of convection cooling vents passing through said first board layer and said second board layer thereby forming said convection cooling vents;

means for creating a centering force that centers leads of a flat pack packaged integrated circuit onto mounting pads arranged on said bonding surface of said first board layer, said plurality of convection cooling vents placed so as to be bounded by said mounting pads; and a plurality of pins fastened to said pin surface of said circuit board, said plurality of pins arranged so that said plurality of pins fit into a pin grid array socket, each of said plurality of pins electrically connected to said one of said mounting pads via circuitries between said first board layer and said second board layer.

5. The add-on card of claim 4 wherein said mounting pads comprise rows of centering pads, said rows centering pads bound by corner alignment pads.

6. A. The add-on card of claim 4 wherein said first board layer and said second board layer are comprised of a fiberglass material.

7. The add-on card of claim 4 further comprising a first and second copper area, said first copper area disposed on said bonding surface of said first board surface and said second copper area disposed on said pin surface of said second board surface, said first and second copper surfaces in electrical communication with a grounding pin.

8. The add-on card of claim 4, wherein said centering force creating means comprises centering pads and corner alignment pads, said centering pads being arranged in a rectangular array and said corner alignment pads placed adjacent to each row of said array of said centering pads, said centering pads having length and width wherein said length is longer than bonding portions of leads of the flat pack packaged integrated circuit that will be bonded thereon.

9. The add-on card of claim 8 wherein said width of said centering pads is greater than bonding portions of leads of the flat pack packaged integrated circuit that will be bonded thereon.

10. The add-on card of claim 9 wherein said width of said centering pad is thirty percent wider and said length is twenty percent longer than said bonding portion of leads of the flat pack packaged integrated circuit that will be bonded thereon.

11. The add-on card of claim 8 wherein said corner alignment pads have greater width and length than said centering pads.

* * * * *